United States Patent [19]
Dodd et al.

[11] Patent Number: 5,621,238
[45] Date of Patent: Apr. 15, 1997

[54] NARROW BAND SEMICONDUCTOR DETECTOR

[75] Inventors: Mark A. Dodd, Dayton; Larry F. Reitz, Springfield; John E. Scheihing, Fairborn, all of Ohio

[73] Assignee: The United States of America as represented by the Secretary of the Air Force, Washington, D.C.

[21] Appl. No.: 612,131

[22] Filed: Mar. 7, 1996

Related U.S. Application Data

[63] Continuation-in-part of Ser. No. 201,683, Feb. 25, 1994, abandoned.

[51] Int. Cl.$^6$ ............................................. H01L 31/075
[52] U.S. Cl. .................. 257/440; 250/548; 250/559.29; 257/184
[58] Field of Search ............................ 257/184, 188, 257/189, 440, 441, 442, 443; 250/548, 561; 356/375; 364/559, 560

[56] References Cited

U.S. PATENT DOCUMENTS

| | | | |
|---|---|---|---|
| 3,478,214 | 11/1969 | Dillman | 257/184 |
| 4,210,805 | 7/1980 | Kobayashi et al. | 250/370 |
| 4,255,659 | 3/1981 | Kaufman et al. | 250/370 |
| 4,415,916 | 11/1983 | Protic et al. | 357/29 |
| 4,422,091 | 12/1983 | Liu | 257/228 |
| 4,679,063 | 7/1987 | White | 357/30 |
| 4,689,649 | 8/1987 | Sato et al. | 357/29 |
| 4,710,589 | 12/1987 | Meyer et al. | 257/184 |
| 4,727,256 | 2/1988 | Kumazawa | 250/370 |
| 4,879,466 | 11/1989 | Kitaguchi et al. | 250/370.14 |
| 4,896,200 | 1/1990 | Seki et al. | 357/30 |
| 5,019,886 | 5/1991 | Sato et al. | 357/29 |
| 5,021,663 | 6/1991 | Hornbeck | 250/349 |
| 5,220,177 | 6/1993 | Harris | 250/548 |

*Primary Examiner*—Stephen Meier
*Attorney, Agent, or Firm*—Bobby D. Scearce; Thomas L. Kundert

[57] ABSTRACT

A semiconductor based radiation detector utilizing a dual absorption layer system design to selectively respond to particular bands of incident radiation while rejecting others. Generally, a top absorption layer initially absorbs all radiation less than a cutoff wavelength. Radiation longer than the cutoff pass to a buried or second absorption layer. This second absorption layer has a smaller band gap energy corresponding with a larger cutoff wavelength than the top layer and is therefore responsive to longer wavelengths or radiation with lower energies. As such, preselected wavelengths or energy bands are detectable by the second layer while all other wavelengths or energy bands are either absorbed by the top layer or passed through both layers. The resultant absorption in the second layer is thereafter detectable to indicate the presence of the desired wavelength.

34 Claims, 3 Drawing Sheets

NARROW BAND SEMICONDUCTOR DETECTOR

This application is a continuation-in-part of application Ser. No. 08/201,683, filed on Feb. 25, 1994 now abandoned.

BACKGROUND

The control of industrial processes and, in particular, the continuous non-contacting evaluation of material during manufacture and production is a subject of continued innovation. Given that essentially all such processes call for some form of guidance control of material, investigators direct much attention toward developing improved monitoring and measuring systems.

One obstacle generally facing all monitoring systems is that materials undergoing these production procedures vary widely in chemical composition, make-up, density, and the like, for example, from transparent plastics to steel billets heated to incandescence. Additionally, speed of movement of these materials ranges from the barely discernible to very fast. Temper mills in the steel industry, for instance, often will convey sheet steel at speeds of about 90 mph (144 km/hr). As another consideration, many industries call for extremely precise and accurate measurement capabilities. As an example, many industries that use steel require that the initial production of rolled steel exhibit accurately controlled widthwise or lengthwise dimensions.

To meet industry demands and achieve the necessary dimensional control monitoring, accurate measurements generally must be carried out on a non-contacting and substantially continuous basis. The resultant control process not only achieves production accuracy, but also minimizes material waste otherwise resulting from continued production under out of tolerance conditions.

Presently, there are a variety of techniques available to monitor, track, and measure moving material. The invention described in U.S. Pat. No. 5,220,177 by Harris, issued Jun. 15, 1993, entitled "Method and Apparatus for Edge Detection and Location" (expressly incorporated herein by reference), has met with market acceptance as a non-contacting edge detector. The Harris invention employs a linear array of light emitting diodes (LEDs) positioned on one side of the material to be monitored wherein each diode of the array is energized to emit light exhibiting substantially uniform intensity. Positioned above the moving material and opposite the associated diode array is a tuned photoresponsive receiver which reacts to the illumination emanating from those dimes which are unblocked or partially blocked at the edges of the moving material. The receiver and associated control system are called upon to carry out an extrapolation process to develop mandated accuracy in locating the position of an edge. This extrapolation is based upon the observation that each LED in the emitting array produces a cone of light, and the light cones from adjacent LED's overlap each other in the light path to the photoresponsive receiver. An edge of a product being measured blocking the light path from the emitting diodes to the receiver will attenuate the light from more than one diode. The signal processing procedure carrying out extrapolation takes samples of the peak amplitude of the light received in sequence from the partially blocked and unblocked LEDs and develops therefrom a time-based stairstep light output pattern representing a scan across the material edge which, in effect, is smoothed through the utilization of a low pass filtering stage. The edge position of the material being observed, then, is defined as the time equivalent point on this smooth curve signal where the voltage drops to one-half of the peak LED signal amplitude.

A number of other systems which incorporate both an optical source be it an LED or a laser, and a photodetector are readily apparent. These systems may use either single or multiple sources and/or detectors for measuring or sensing some feature in the optical path between the source and detector. This feature may be a flaw, hole or edge of some material being passed through the optical path. Another possibility may be strictly sensing presence of absence of the source radiation. In these cases, the system may be used for position sensing of either the source or detector components. A third system would be one which detects and/or measures the concentration of airborne particles or gases which may absorb the source radiation. Generally, transmitted light is detected and converted into an electrical signal. The signal may then be amplified and compared against a threshold. In other applications the magnitude of the electrical signal is an indicia of the state of the optical path, i.e., whether it is blocked, or something is partially absorbing the source radiation. Other embodiments operate similarly in that they use a series of conventional charge coupled devices (CCDs) oppositely disposed from an infrared light source. As light falls on the CCD photosensitive elements, signals are produced and converted to represent the intensity pattern. Thereafter, a transition point between a high-voltage value and a low-voltage value is used to represent the location of the edge.

These devices, however, have proven less than effective in certain adverse ambient conditions. Specifically, in many manufacture and production industries, air borne particles, such as dust, dirt, smoke, pollutants, and the like, become prevalent in and around the detecting system. As a result, these particles tend to accumulate on the detector and emitter obscuring readings and signal detection capabilities.

Other inherent shortcomings with past devices include, for example, variations in the intensity of each detector's output is inevitable due to changes in the sensitivity of the detector. Such variations typically stem from changes in the supply voltage, detector aging, and general wear on the optical components. Particularly in harsh industrial environments, component lifetimes are greatly reduced. For example, LED detectors in mills often are required to measure steel which typically is heated to a level of incandescence above 3,000° F. (1,649° C). Additionally, depending on the industrial application, from 10 to 400 diodes may be needed. It has been observed, however, that LED light output from an average purchased lot varies by 30% or more. Lastly, many of these devices are expensive to manufacture in that they involve an overall complex system necessarily requiting a significant amount of electronics.

Semiconductor based devices are also used as detectors. These detectors generally are used to detect light and radiation, particularly high level radiation such as γ-ray or x-ray radiation, or longer radiation such as infrared. Conventional high level detectors typically have a single-crystal silicon based substrate with a p-n junction or Schottky junction. A reverse bias is applied across the junction to separate substrate surface regions to form a depletion region generally equal in size to the range of mobility of generated electrons. As radiation penetrates and strikes the depletion region, electron-hole pairs (EHPs) are created to provide a detectable signal.

Another class of semiconductor-based radiation detectors employed in industry are photovoltaic detectors which include photodiodes and junction diode detectors. In photodiode systems, a detectable current resulting from drift of minority carriers across a p-n junction occurs as a result of thermal or optical excitation of EHPs. In particular, radiation having hv greater than the band gap energy of the semiconductor incident on the junction will generate an EHP. Correspondingly, a drift current is generated such that EHPs generally within a diffusion length of each side of the junction diffuse to the transition region, thereafter providing a detectable signal. This phenomenon is characteristic of photodiodes operating in the third or fourth quadants of its I-V characteristics curve.

Presently, these semiconductor-based radiation detectors are not known to be successfully employed with positional and dimensional monitoring instrumentation. One problem associated with these devices is the unwanted detection of noise and other extraneous radiation. Specifically, all incident radiation having energy greater than the semiconductor band gap energy causes the generation of an EHP. Thus, for example, if photovoltaic detectors are being used to detect infrared radiation, any other radiation with a shorter wavelength similarly would excite the device, thus causing unwanted EHP generation. Problems particularly arise in environments exhibiting a wide range of ambient radiation. Steel mills, for example, have radiating sources ranging at least from molten steel to overhead strobes on motorized tow-motors.

For a fuller understanding of this technology including examples of semiconductor detectors, refer to the following: B. G. Streetman, *Solid State Electronic Devices*, (1980); U.S. Pat. No. 4,210,805, entitled "Semiconductor Radiation Detector", issued Jul. 1, 1980; U.S. Pat. No. 4,679,063, entitled "Infra Red Detectors", issued Jul. 7, 1987; U.S. Pat. No. 4,896,200, entitled "Novel Semiconductor-Based Radiation Detector", issued Jan. 23, 1990; and U.S. Pat. No. 5,019,886, entitled "Semiconductor-Based Radiation-Detector Element", issued May 28, 1991, the disclosures of which are expressly incorporated herein by reference.

SUMMARY

Broadly, disclosed is a detector for detecting a wavelength band of energy emitted from a wavelength source and incident on said detector. Such detector includes at least four layers of semiconductors. Layer one is an incident absorption semiconductor having a wavelength cutoff absorption of $\lambda 1$. Layers two and four are doped semiconductor material, for example, a conducting n-type semiconductor or a conducting p-type semiconductor. Layer three is an absorption semiconductor having a wavelength cutoff absorption of $\lambda 2$. $\lambda 2$ is longer than $\lambda 1$, whereby an indicia evoked by layers two and four is sensed to detect said wavelength band incident on said detector. The sensed indicia includes, for example, current, voltage, induction, magnetism, and the like. Each layer may be composed of one or more semiconductor laminae.

Advantageously, an array of such detectors are used opposite a selective source of radiation with material to be sensed interposed therebetween. The edge of the material can be determined accurately, even in the confines of the most harsh of industrial environments, by such array.

Advantages of the present invention include a positional and dimensional monitoring instrumentation which is sensitive only to narrow radiation bands. Another advantage is the ability of the inventive detector to withstand adverse ambient conditions, and yet provide economical and precise measurements. These and other advantages will be readily apparent to those skilled in this art.

The drawings will be described in detail below.

DETAILED DESCRIPTION

In the description that follows, the precepts of the present invention are illustrated in connection with its use as a narrow band detector, and particularly in the use as a non-contacting monitoring system of material during manufacture and production. However, in view of its advantages, the present invention will find use in other band detection applications. The present invention, for example, has application as an electro-optical range finder, a laser range finder receiver detector, an optical communications receiver that can detect modulation in the giga hertz range, a bar code scanner receiver detector, a surveying laser light receiver detector, a motion detector, a location detector, a position determination receiver detector, a fiber optic light receiver detector, a collision avoidance system receiver detector, or an open air telemetry receiver detector.

Figure 1:
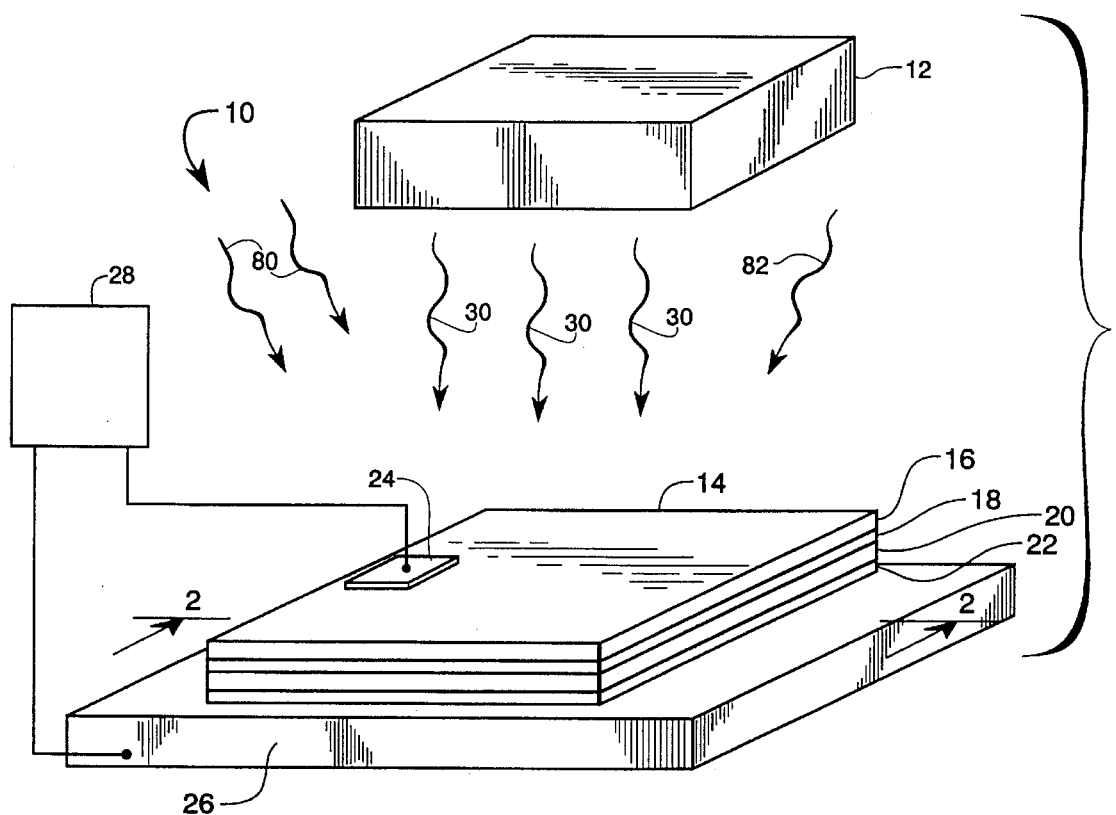
FIG. 1 is a perspective view of the radiation doctor system according to the invention.

Looking to FIG. 1, an exemplary embodiment of the present invention is revealed. A detector system is shown generally at 10 to include radiation or wavelength source 12, semiconductor radiation band detector 14, and two ohmic (electrical) contacts 24 and 26 connected to external circuit 28 which measures one or more of voltage, current, inductance, or magnetism. The design of band detector 14 employs a multi-layering configuration. Examining the band detector configuration more specifically and looking additionally to FIG. 2, band detector 14 is seen to consist of several, tactilely disposed layers. Preferably, the layering configuration is GaAs/InGaAs and is adapted for use in the spectral range of 900–1000 nm. Shown are first layer 16, second layer 18, third layer 20, and fourth layer 22. First layer 16 has contact 24 connected thereto and is a highly doped n-type GaAs top absorption layer. Second layer 18 is also a highly doped n-type material. Both layers 16 and 18 use Si as an n-type dopant at a concentration of, for example, about $10^{18}$ cm$^{-3}$. Third layer 20 is an intrinsic bottom absorption layer. Fourth layer 22 has contact 26 extending along one side and is, preferably, a highly doped p-type material with a dopant concentration of, for example, $2\times10^{19}$ cm$^{-3}$. Layers 18, 20, and 22 are composed of InGaAs with an indium mole fraction of 0.1.

Band detector 14 may be grown by any of several known crystal growth techniques, such as, for example, metal-organic vapor phase deposition (MOCVD) or molecular beam epitaxy (MBE). In the latter method, the semiconductor substrate is placed in a high vacuum chamber and bombarded with molecular beams of the constituent elements. This technique is illustrated in the growth of InGaAs layers on the GaAs substrate. Constituents elements are heated in separate cylinders and then beamed onto the substrate. Changes in crystal or dopant concentrations are easily controlled with shutters. With regard to crystal growth, it has been found that due to the highly conductive nature of first layer 16, patterned n-type contacts are evaporated onto this surface while patterned p-type contacts are evaporated onto fourth layer 22. Either wet or chemical etching may be used to delineate the band detector into mesas. The layers are grown consecutively; although, it is possible to separately grow the layers and thereafter tactilely join them.

Figure 2:
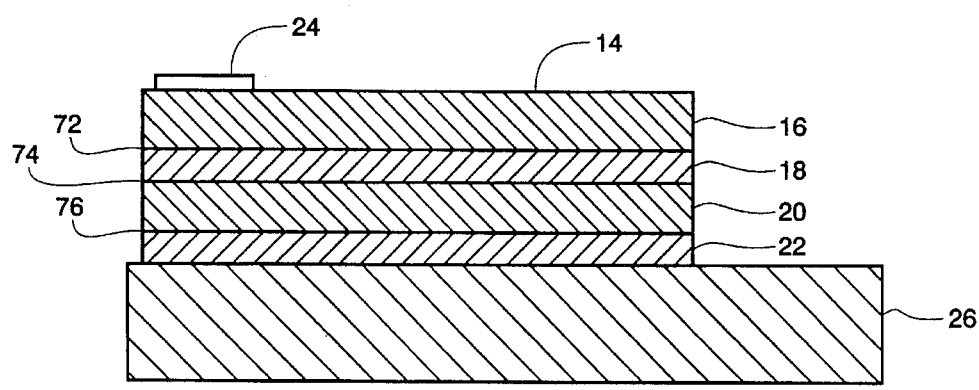
FIG. 2 is a sectional view taken through the plane 2—2 of FIG. 1.

Referring still to FIGS. 1 and 2, band detector 14 utilizes a dual absorption layer configuration designed to respond to particular bands of incident radiation. As an overview, top absorption layer 16 initially absorbs all radiation less than a cutoff wavelength, $\lambda 1$. Wavelengths longer than the cutoff pass to the buffed or bottom absorption layer 20. This bottom absorption layer has a smaller bandgap energy corresponding with a larger cutoff wavelength, $\lambda 2$, than the top absorption layer 16 and, therefore, is responsive to longer wavelengths or radiation with lower energies. Depending on the difference in cutoff wavelengths, $\lambda 2-\lambda 1$, preselected wavelengths or energy bands are detectable by bottom absorption layer 20 while other shorter wavelengths or higher energy bands are absorbed by top absorption layer 16. Absorption in the bottom layer is thereafter detectable by circuit 28, indicating the presence of the desired wavelength. Indicia detectable by circuit 28 includes, for example, voltage, current, induction, magnetism, and the like. Design and implementation of the external circuit is within the capability of the skilled artisan based on the precepts disclosed herein.

Examining absorption in more detail, desired response radiation 30 (FIG. 1) is emitted from radiation source 12 and is incident on top absorption layer 16. Semiconductors, and in particular LEDs, are usable radiation sources. Typically, source 12 is an LED emitting in a range of, for example, 0.9 μm to 1.0 μm, but not necessarily continuously over this range. The distance and position of wavelength source 12 with respect to band detector 14 is variable and depends on such factors as, for example, semiconductor material, radiation wavelength, absorption coefficients, and the application at hand. Generally, though, this distance and position must be selected so that radiation 30 is effectively incident on band detector 14 to generate the excitation of electron-hole pairs (EHPs) within the semiconductor material and thereby evoke a detectable indicia by circuit 28. Other radiation emitting devices may be used including, for example, a laser source emitting between 0.9 μm to 0.97 μm.

Figure 3:
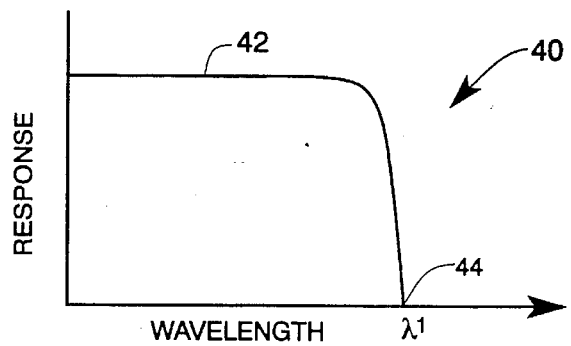
FIG. 3 is a wavelength to absorption response curve of a top absorption layer of the semiconductor band detector of FIG. 1.
Figure 4:
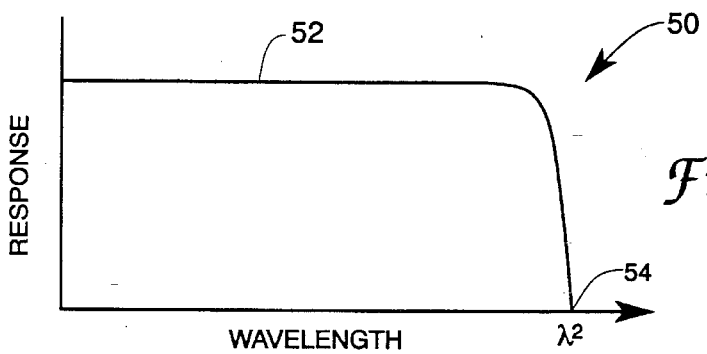
FIG. 4 is a wavelength to absorption response curve of a bottom absorption layer of the semiconductor band detector of FIG. 1.
Figure 5:
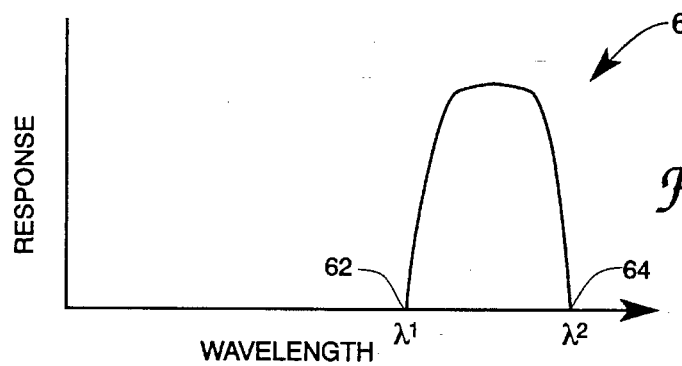
FIG. 5 is a wavelength to absorption response curve of the net absorption of FIG. 3 and FIG. 4.

FIGS. 3–5 various wavelength to absorption response curves for top absorption layer 16, bottom or buried absorption layer 20, and the net absorption of both layers, respectively, wherein the vertical axis represents absorption response and the horizontal axis represents wavelengths of increasing magnitude as progression is made away from the vertical axis.

Referring specifically to FIG. 3, shown is top layer 16 which has a wavelength to absorption response characteristic curve shown generally at 40 where horizontal portion 42 shows wavelengths which are absorbed. In general, absorption occurs if the incident radiation has a greater energy than the band gap energy of the top layer 16, while radiation of lesser energy is transmitted. Top absorption layer 16 is a doped n-type with dopants chosen to make the layer sensitive only to radiation of certain wavelengths or energies. If absorption occurs, excess electron-hole pairs are created in the conduction and valence bands. At a cutoff wavelength, on the other hand, the energy associated with the radiation is not great enough to excite the generation of an EHP. Shown at 44 is a cutoff wavelength $\lambda 1$ for top layer 16. As the curve indicates, all radiation of wavelength greater than $\lambda 1$ is not absorbed but is passed through top layer 16.

Turning now to FIG. 4, a wavelength to absorption response characteristic curve is shown generally at 50 for bottom absorption layer 20. As in FIG. 3, horizontal portion 52 represents wavelengths which are absorbed up to a cutoff wavelength $\lambda 2$ shown at 54. It is important here to note that bottom layer 20 is responsive to longer wavelengths than top layer 16. This difference in wavelength response is represented by the fact that $\lambda 2$ is greater than $\lambda 1$. As such, radiation incident on top layer 16 of wavelength greater than $\lambda 1$ is passed to bottom layer 20. If the passed radiation has a wavelength greater than $\lambda 1$ but less than $\lambda 2$, the radiation is absorbed by bottom layer 20. This net absorption response is illustrated generally at 60 in FIG. 5. Here, $\lambda 1$ is shown at 62 and $\lambda 2$ at 64. As the curve indicates, all wavelengths between $\lambda 1$ and $\lambda 2$ are absorbed by layer 20. Wavelengths shorter than $\lambda 1$ are absorbed by top layer 16 (FIG. 3), and wavelengths longer than $\lambda 2$ are passed through both absorption layers.

Figure 6:
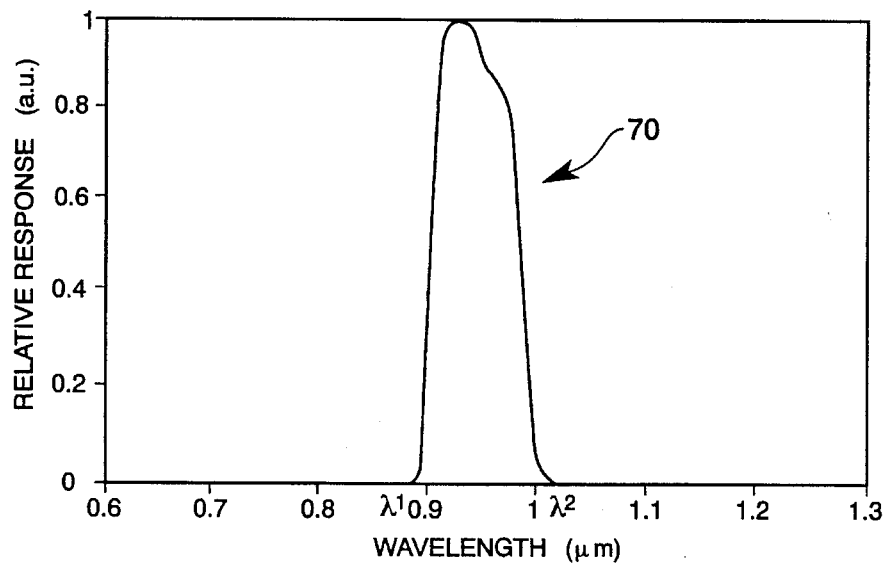
FIG. 6 is a detailed wavelength to absorption response curve of FIG. 5.

FIG. 6 at 70 shows the net absorption response curve of FIG. 5 in more detail for the preferred embodiment of the invention. As the curve illustrates, $\lambda 1$ is approximately 0.9 μm while $\lambda 2$ is approximately 1.0 μm. Further data corresponding with FIG. 6 is summarized as follows:

| | |
|---|---|
| Peak wavelength response | 0.2928 μm |
| Full width at half maximum of response | 0.084 μm |
| PV responsivity | 80 KV/W |
| PC responsivity | 0.33 A/W |
| S/N in the spectral range of 0.6 μm to 1.3 μm | ~8000 |

It has been illustrated that band detector 14 is responsive only to radiation of particular wavelengths, namely between $\lambda 1$ and $\lambda 2$ as depicted in FIGS. 5 and 6. It will be appreciated that various layering configurations may be employed within band detector 14 in order to include or exclude different radiation wavelengths to which the detector is responsive. For example, changing the doping profile by substituting n-type for p-type or vice-versa could be advantageous for certain applications or materials. Band detector 14 is described using both n-type and p-type doping. It would be possible to use only n-type or only p-type doping, requiring operation in the photoconductive mode. As another example, individual layers 16, 18, 20, and 22 may be composed of one or more semiconductor laminae.

Doping also can be used to vary the band gap energies available or to alter frequency response or crystal growth related formations. In particular, when impurities or lattice defects are introduced within any of the semiconductor layers 16, 18, 20, or 22, donor levels or acceptor levels are additionally created in the band gap. By doping with different compounds, the location of the acceptor and donor levels can be created and controlled. In turn, then, radiation wavelengths can be selected for absorption. Doping also can be used to control the width of the depletion region. One way to control the depletion region width is to layer doped semiconductor material around an intrinsic region.

The most effective way to change the absorption band or spectral response of FIGS. 5 and 6 is to alter the composition of one or any combination of layers 16, 18, 20, or 22. By way of example, one change is to have layers 18, 20, and 22 be InGaAs with an indium mole fraction of 0.2. Another example would be to have layer 16 composed of AlGaAs with an aluminum mole fraction of 0.2 and have layers 18, 20, or 22 composed of GaAs. The variations in layer composition are numerous and allow for preselecting the spectral response of band detector 14.

Shown in FIG. 2 is a pin active region for bottom absorption layer 20 surrounded by n-type layer 18 and p-type layer 22. Intrinsic region 20 need not be truly intrinsic, but may be doped either n-type or p-type. In the preferred configuration, the carrier lifetime is long within this region compared with the drift time so the number of electron-hole pairs collected in the n or p regions is maximized. After radiation absorption in pin active region 20 occurs, an electric field, caused by ions from electron and hole diffusion, separates the electrons and holes generated. Thereafter, these generated electrons and holes drift to the n-type and p-type contacts, shown at 24 and 26, respectively.

The thickness of layers 16, 18, 20, or 22 also can be tailored for different applications. Preferably, layers 18, 20, and 22 have a thickness of 0.2 µm, 2.0 µm, and 0.2 µm, respectively. A typical trade-off with thickness variation would be responsivity and frequency response. A thicker absorption layer reduces frequency response, while a thinner absorption layer increases bandwidth but reduces responsivity. Absorption within the layers follows an exponential rule, with absorption=$e^{\alpha L}$. Typical values for the product $\alpha L$ are 1 to 3. As such, slight variations in layer thickness have a negligible impact on overall performance. Additionally, each layer can be constructed from one or more semiconductor lamina to form a sandwich construction within each layer.

Returning now to FIG. 2, the layering configurations are represented in more detail. Shown are three junctions 72, 74, and 76. The depth of these junctions may vary depending on the application of detector system 10. Commonly, this depth is approximately equal to a diffusion length. Thus, for example, the junction depth should be less than the hole diffusion length in the n-type material in order to allow holes generated in the n-region away from the junction to diffuse to the junction before recombination occurs. Similarly, the depth of the p-type region should be less than the electron diffusion length such that the electrons generated can diffuse to the junction before they recombine. As such, a proper match between the electron or hole diffusion length, the thickness of pin active region 20, and the mean optical penetration depth, should exist. Additionally, biasing the device can change the operating characteristics in desired ways, such as reducing capacitance, increasing the speed of response, or changing depletion region depth.

As described, detector system 10 of FIG. 1 is adapted to be a narrow band radiation detector. The system is particularly suited in environments exhibiting noise or other extraneous radiation sources. In this regard, extraneous radiation having shorter wavelengths 80 than the desired response wavelength 30 are absorbed by top layer 16, and radiation with larger wavelengths 82 than wavelength 30 pass through both top and bottom absorption layers, 16 and 20. As such, only radiation of wavelength 30 is detected by bottom layer 20.

Figure 7:
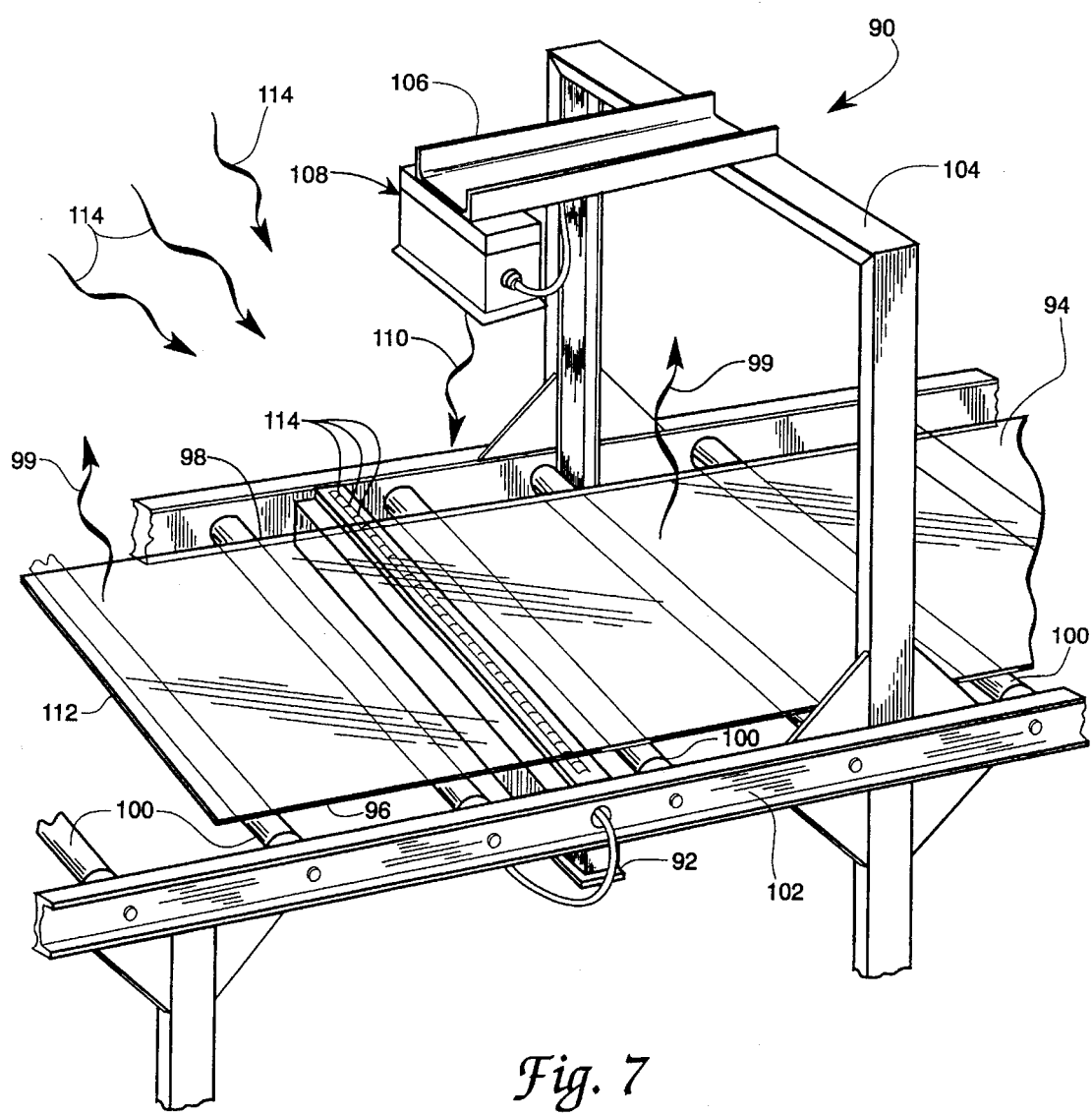
FIG. 7 is a perspective view of the invention of FIG. 1 showing its employment in the edge detection of materials.

One such application for detector system 10 of FIG. 1 is as a non-contacting monitoring system. Referring to FIG. 7, an exemplary industrial application of system 10 is revealed generally at 90 as a non-contacting edge detecting apparatus. Apparatus 90 includes housing 92 which supports an array of semiconductor band detectors 14 (shown in FIGS. 1 and 2). Housing 92 is located at one side, here the bottom side, of continuously moving sheet of material 94, such as hot sheet steel, the width of which or edge positions of which are indicated at 96, 98, and 112. As seen, the position of housing 92 allows edges 96, 98, and 112 to bisect band detector 14. Sheet 94 is itself shown to emit radiation 99. In this regard, band detector 14 is particularly suited for use in extreme ambient conditions since it is capable of detecting only selected narrow energy bands. It should be noted that although the maximum operating temperature is not known, the band detector is operable up to at least 100° C., in spite of excess thermally generated electron-hole pairs and a decrease in carrier mobility.

Conveyor rolls 100 are seen to support sheet material 94 and are themselves mounted upon support structure 102 which, in turn, is seen to support channel form, U-shaped support 104. Support 104 includes forwardly extending channel 106 which supports LED 108 emitting radiation 110 over band detector 14. The stand-off height of LED emitter 108 with respect to band detector 14 is variable depending upon manufacturing process constraints. This height, however, must be selected so that radiation 110 is effectively incident on band detector 14 so as to generate an electron-hole pair within the semiconductor material. Additionally, the length or positioning of band detector 14 will vary depending upon the edge location to be determined, such as widthwise edges 96 and 98 or lengthwise edge 110.

By way of illustration, the detection of edge 112 is examined with reference to FIGS. 1, 2, and 7. As long as sheet material 94 is between band detector 14 and LED 108, radiation 110 is not detected. Other radiation, however, such as radiation 99 emitted from the sheet material 94 passing to band detector 14 or extraneous radiation from other sources 114, will be absorbed by top layer 18 or passed through the band detector completely. When edge 112 is located above band detector 14, radiation 110 passes through top layer 16 and is absorbed by bottom layer 20. At this instant, excess electron-hole pairs are generated in the conduction and valence bands within bottom absorption layer 20. This excess generation is then detectable as a signal in a circuit, for example, as a change in voltage, current, induction, or magnetism and is used to indicate the location of edge 112. An example of one circuit used to process such a signal is illustrated in U.S. Pat. No. 5,220,117 by Harris, referenced above.

Since certain changes may be made in the above apparatus without departing from the scope of the invention herein involved, it is intended that all matter contained in the above description or shown in the accompanying drawings shall be interpreted as illustrative and not in a limiting sense. All citations referred to herein are expressly incorporated by reference.

We claim:

1. Apparatus for locating an edge of material having an edge and two sides, which comprises:

(a) an array of detectors, each detector comprising at least four layers of semiconductors, layer one being an incident absorption semiconductor having a wavelength cutoff absorption of $\lambda 1$, layers two and four being doped semiconductor material, layer three being an absorption semiconductor having a wavelength cutoff absorption of $\lambda 2$, where $\lambda 2$ is longer than $\lambda 1$;

(b) a wavelength source emitting a wavelength band to be detected by said detector, where the wavelength band to be detected ranges between λ1 and λ2, and spaced-apart from said array so that said material edge can be passed between said array and said wavelength source, an indicia being evoked within said array when said wavelength band to be detected is effectively incident on certain detectors within said array; and (c) a processor which derives a signal from said indicia representing the location of the edge of said material.

2. The detector of claim 1, wherein at least one of said four layers is doped n-type semiconductor material, and at least one other of said four layers is doped p-type semiconductor material.

3. The detector of claim 2, wherein said layer one and said layer two are doped n-type semiconductor material, and said layer four is doped p-type semiconductor material.

4. The detector of claim 1 which further comprises:

a circuit; and a first electrical contact and a second electrical contact which are connected to nonadjacent layers, where said contacts are connected with said circuit to provide communication of said indicia thereto.

5. The detector of claim 4, wherein said first contact connects to said layer one and said second contact connects to said layer four.

6. The detector of claim 4, wherein said circuit measures one or more of voltage, current, inductance, or magnetism.

7. The detector of claim 1, wherein said indicia is one or more of voltage, current, inductance, or magnetism.

8. The detector of claim 1, wherein said four layers are composed of one or more of GaAs, AlGaAs, or InGaAs.

9. The detector of claim 1, wherein each of said four layers can be one or more semiconductor laminae.

10. The detector of claim 1, wherein the difference between α2 and α1 is about 0.1 micrometers.

11. The detector of claim 1, wherein said layers two, three, and four have a thickness of about 0.2 micrometers, 2.0 micrometers, and 0.2 micrometers, respectively.

12. A method for locating an edge of material having an edge and two sides, comprising the steps of:

(a) providing an array of detectors, each detector comprising at least four layers of semiconductors, layer one being an incident absorption semiconductor having a wavelength cutoff absorption of λ1, layers two and four being doped semiconductor material, layer three being an absorption semiconductor having a wavelength cutoff absorption of λ2, where λ2 is longer than λ1;

(b) positioning said array a select distance from one side of said material so that said edge to be located bisects said array;

(c) providing a wavelength source emitting a wavelength band to be detected by said detector, where the wavelength band to be detected ranges between λ1 and λ2;

(d) positioning said wavelength source a select distance from the other side of said material so that said emitting wavelength band is receivable by said detector;

(e) passing said material edge between said array and said wavelength source;

(f) sensing an indicia evoked within said array when said wavelength band to be detected is effectively incident on certain detectors within said array; and (g) processing said indicia to derive a signal representing the location of the edge of said material.

13. The method claim 12, wherein at least one of said four layers is provided as a doped n-type semiconductor material, and at least one other of said four layers is provided as a doped p-type semiconductor material.

14. The method claim 13, wherein said layer one and said layer two are provided as doped n-type semiconductor material, and said layer four is provided as doped p-type semiconductor material.

15. The method of claim 12 further comprising the steps of:

providing a circuit; and providing a first electrical contact and a second electrical contact which are connected to nonadjacent layers, where said contacts are connected with said circuit to provide communication of said indicia thereto.

16. The method claim 15 further comprising the steps of:

connecting said first contact to said layer one; and connecting said second contact to said layer four.

17. The method claim 15 further comprising the step of measuring one or more of voltage, current, inductance, or magnetism with said circuit.

18. The method claim 12 wherein said indicia is provided as one or more of voltage, current, inductance, or magnetism.

19. The method claim 12, wherein said four layers are provided as one or more of GaAs, AlGaAs, or InGaAs.

20. The method claim 12, wherein each of said four layers can be provided as one or more semiconductor laminae.

21. The method claim 12, wherein the difference between λ2 and λ1 is provided as about 0.1 micrometers.

22. The method claim 12, wherein said layers two, three, and four are provided having a thickness of about 0.2 micrometers, 2.0 micrometers, and 0.2 micrometers, respectively.

23. The method claim 12, wherein said material is at a temperature ranging up to about 3000° F.

24. An optical detector system, comprising:

(a) at least one detector, each detector including at least four layers of semiconductors, layer one being an incident absorption semiconductor having a wavelength cutoff absorption at a first wavelength, layers two and four being doped semiconductor material, layer three being an absorption semiconductor having a wavelength cutoff absorption at a second wavelength, where said second wavelength is longer than said first wavelength;

(b) a wavelength source emitting a wavelength band to be detected by said detector, where the wavelength band to be detected is between said first wavelength and said second wavelength, and spaced apart from said detector, whereby an indicia is evoked within said detector when said wavelength band to be detected is incident on said detector; and (c) a processor which derives a signal from said indicia representing the detection of said wavelength band.

25. The detector system of claim 24, wherein at least one of said four layers is doped n-type semiconductor material, and at least one other of said four layers is doped p-type semiconductor material.

26. The detector system of claim 25, wherein said layer one and said layer two are doped n-type semiconductor material, and said layer four is doped p-type semiconductor material.

27. The detector system of claim 25, further comprising a circuit and a first electrical contact and a second electrical contact which are connected to nonadjacent layers, where said contacts are connected with said circuit to provide communication of said indicia thereto.

28. The detector system of claim 27, wherein said first contact connects to said layer one and said second contact connects to said layer four.

29. The detector system of claim 27, wherein said circuit measures one or more of voltage, current, inductance, or magnetism.

30. The detector system of claim 24, wherein said indicia is one or more of voltage, current, inductance, or magnetism.

31. The detector system of claim 24, wherein each of said four layers comprise a material selected from the group consisting of GaAs, AlGaAs and InGaAs.

32. The detector system of claim 24, wherein the difference between said second wavelength and said first wavelength is about 0.1 micrometers.

33. The detector system of claim 24, wherein said layers two, three, and four have a thickness of about 0.2 micrometers, 2.0 micrometers, and 0.2 micrometers, respectively.

34. The detector system of claim 24 comprising a plurality of said detectors in an array.

* * * * *